United States Patent [19]
Nakagawa et al.

[11] Patent Number: 6,046,902
[45] Date of Patent: Apr. 4, 2000

[54] CERAMIC ELECTRONIC PART HAVING U-SHAPE TERMINALS

[75] Inventors: Takuji Nakagawa; Yoshikazu Takagi; Masayoshi Miyazaki; Hideki Nakayama; Masaru Takahashi; Akira Nakamura, all of Kyoto-fu, Japan

[73] Assignee: Murata Manufacturing Co., Ltd., Japan

[21] Appl. No.: 09/121,498

[22] Filed: Jul. 23, 1998

[30] Foreign Application Priority Data

| Jul. 23, 1997 | [JP] | Japan | 9-196631 |
| Feb. 17, 1998 | [JP] | Japan | 10-035173 |
| Feb. 18, 1998 | [JP] | Japan | 10-035712 |

[51] Int. Cl.[7] .............. H01G 4/228; H01G 2/06
[52] U.S. Cl. ........................ 361/306.1; 361/309
[58] Field of Search ................ 361/301.4, 304, 361/306.1, 308.1, 309, 310; 29/25.41, 25.42

[56] References Cited

FOREIGN PATENT DOCUMENTS

| 5-283280 | 10/1993 | Japan . |
| 10-275738 | 10/1998 | Japan . |
| 10-275739 | 10/1998 | Japan . |
| 10-275740 | 10/1998 | Japan . |
| 10-303060 | 11/1998 | Japan . |
| 1326101 | 8/1973 | United Kingdom . |

*Primary Examiner*—Kristine Kincaid
*Assistant Examiner*—Anthony Dinkins
*Attorney, Agent, or Firm*—Ostrolenk, Faber, Gerb & Soffen, LLP

[57] ABSTRACT

A ceramic electronic part includes at least one chip ceramic electronic part body having terminal electrodes and terminals provided on both sides. Each terminal is composed of a metal plate bent into a U shape. The outer face of a first leg of each bent terminal faces and is attached to a terminal electrode, and a second leg is attached to a substrate. The inner face of the bent terminal is provided with a solder-phobic surface not having affinity for solder, and the outer face of the bent terminal is provided with a solder-philic surface having high affinity for solder.

20 Claims, 4 Drawing Sheets

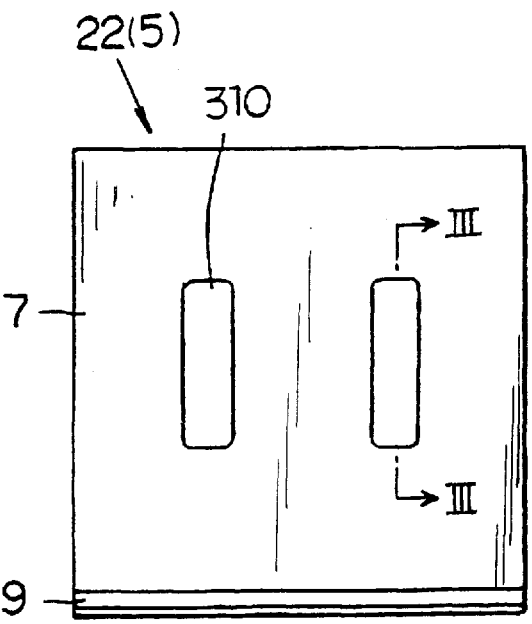
FIG. 6
FIG. 7
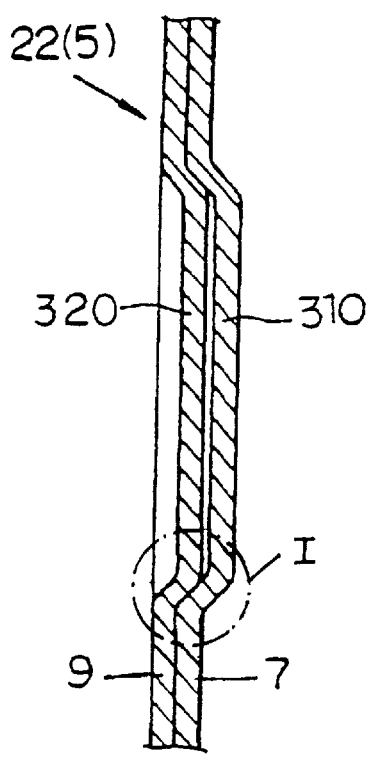
FIG. 8
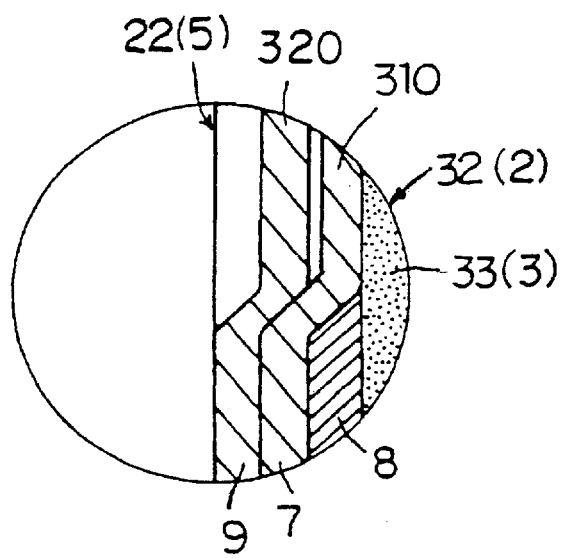

CERAMIC ELECTRONIC PART HAVING U-SHAPE TERMINALS

BACKGROUND OF THE INVENTION

1. Field of the Invention

The present invention relates to ceramic electronic parts and method for producing them. The ceramic electronic parts have a terminal section which reduces stresses which would otherwise be applied to the ceramic electronic part as a result of repeated thermal expansion and contraction.

2. Description of the Related Art

When ceramic electronic parts such as monolithic ceramic capacitors are mounted on an aluminum substrate they tend to break due to differences between the rates of thermal expansion of the aluminum substrate and the ceramic capacitor itself. An aluminum substrate exhibits a high level of heat dissipation and will expand and contract during consecutive temperature cycles of rising and falling temperature to a greater degree than the ceramic capacitor itself. This results in repeated stresses being placed on the capacitor which often result in breakage.

This problem is exasperated in high-capacity lead-based monolithic ceramic capacitors required in the electric power market, which have relatively low bending strength.

A partial solution to this problem is disclosed in, for example, Japanese Patent Laid-Open No. 5-283280. The disclosed monolithic ceramic capacitor has two external electrodes. Each external electrode has two corners and is provided with a terminal which extends from the external electrode. The terminal is bent to extend along the external electrode to be close to the external electrode. The monolithic ceramic capacitor is mounted on the substrate by soldering. Because the terminal extends away from the ceramic capacitor, stresses caused by thermal expansion and shrinkage of the substrate are absorbed by the movement of the terminal and are not applied to the capacitor body. A gap of 0.5 to 1.0 mm is formed between a cap section and the terminal, and the terminal is pre-plated with solder to improve soldering characteristics.

The terminal, however, has the following problems. Since the terminal is bent to be close to the external electrode, the solder used for mounting the monolithic ceramic capacitor on the substrate will easily bridge the gap between the terminal and the external electrode. The solder bridge inhibits the movement of the terminal and the terminal no longer acts as a buffer to the thermal stress applied to the substrate, and thus the monolithic ceramic capacitor will break as a result of thermal shock.

A larger gap between the bent terminal section and the cap will prevent bridging of the solder into the gap. However, in such a case, the gap between the capacitor body and the wiring substrate increases when the capacitor is soldered onto the wiring substrate. The increased gap will decrease the shear strength of the terminal, a strength which endures against deformation. If a transverse force is applied to the capacitor body, the terminal will be easily deformed. The deformed terminal will come into contact with the wiring substrate or the other electronic parts, resulting in a change in electronic characteristics or short-circuiting.

SUMMARY OF THE INVENTION

It is an object of the present invention to provide a ceramic electronic part free from the above-mentioned disadvantages.

A ceramic electronic part in accordance with the present invention includes at least one chip ceramic electronic part body having terminal electrodes provided on opposite sides thereof. Terminals, each preferably composed of a generally metal plate bent into a U shaped configuration, are attached to the terminal electrodes. Particularly, the outer face of a first leg of each bent terminal faces and is attached to a terminal electrode, and a second leg is attached to a substrate. The outer face of the bent terminal is provided with a solder-philic surface (a surface which solder does adhere to), and the inner face of the bent terminal is provided with a solder-phobic surface (a surface which solder does not adhere to).

According to one preferred embodiment of the present invention, the metal plate originally has two surfaces having excellent soldering characteristics and a solder-phobic surface is formed by treatment of one of the two surfaces to cause it to have a poor affinity for solder. The solder-philic surface is the other surface of the metal plate itself. The treatment may include, inter alia, coating a resinous material onto the surface of the metal plate. The resinous material may be selected from the group consisting of nonconductive resins, rubbers and conductive resins. The solder-philic surface of the metal plate may be a surface having solder formed thereon.

In another embodiment of the present invention, the metal plate has two surfaces having poor soldering characteristics, and the solder-phobic surface is one surface itself of the metal plate. The solder-philic surface is formed by treatment of the other surface of the metal plate to cause it to have an affinity for solder. The treatment may include placing a coating of a solder-philic metal material onto the surface of the metal plate. The solder-philic metal material may be selected from the group consisting of Ag, Au and Pd.

If desired, at least a portion of one bent leg may come into contact with the other bent leg.

The first and second legs of each bent terminal can be made substantially coextensive with each other and substantially parallel to one another. In the preferred embodiment the opposing surfaces of each respective terminal are in contact with one another over substantially the entire length of the legs. The ceramic electronic part in accordance with the present invention may include one or more ceramic electronic part bodies. The terminal is attached to terminal electrodes of these ceramic electronic part bodies.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

FIG. 6 is a side view of a ceramic electronic part constructed in accordance with another embodiment of the present invention;

FIG. 7 is an enlarged cross-sectional view taken along the line III—III in FIG. 6; and FIG. 8 is an enlarged cross-sectional view of the section I of the terminal shown in FIG. 7.

DESCRIPTION OF THE PREFERRED EMBODIMENTS

First Embodiment

Figure 1:
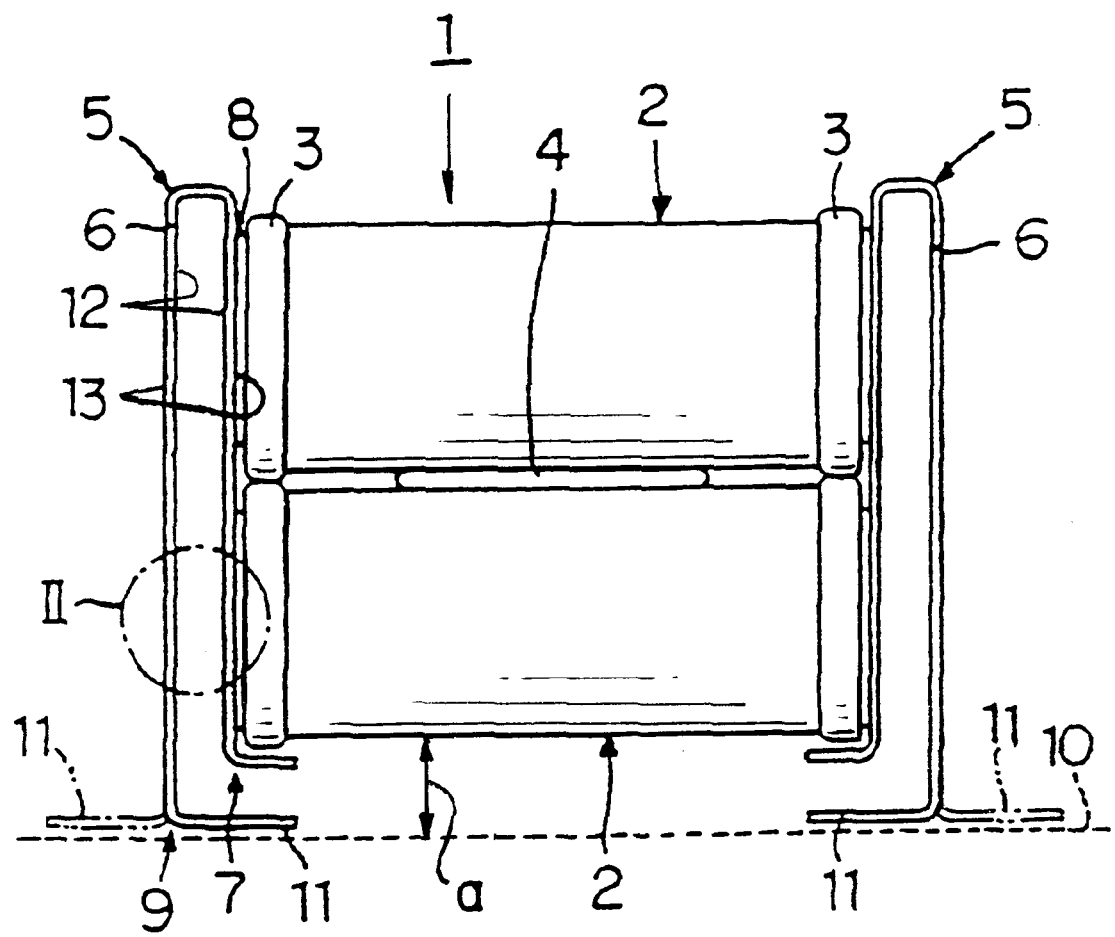
FIG. 1 is a front view of a ceramic electronic part constructed in accordance with a first embodiment of the present invention.
Figure 2:
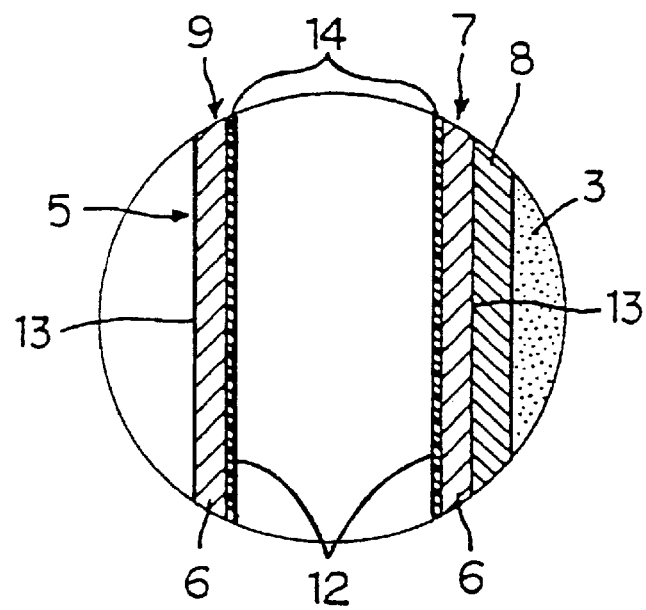
FIG. 2 is an enlarged cross-sectional view of the section II in FIG. 1.

Referring now to the drawings wherein like numerals indicate like elements, there is shown in FIG. 1 a front view of a ceramic electronic part, for example a monolithic ceramic capacitor, constructed in accordance with a first embodiment of the present invention and designated generally as 1. Ceramic electronic part 1 includes two chip ceramic electronic part bodies 2, each provided with a respective pair of electrodes 3 on opposite ends thereof. Terminal electrodes 3 may be formed by a thin-film deposition process such as sputtering, evaporation or plating, or by a thick-film forming process such as coating and baking of a conductive paste. The thick film formed by the thick-film forming process may be subjected to plating. The ceramic electronic part bodies 2 are stacked in the same direction and bonded to each other by a bonding agent 4.

A pair of common terminals 5 are attached to the right and left pairs of terminal electrodes 3, respectively. Each terminal 5 is preferably composed of a metal plate 6 that is bent into a U shape to first and second opposing legs 7 and 9. The legs 7 and 9 have opposing solder phobic surfaces 12 and non-opposing solder-philic surfaces 13. The solder-philic surface 13 of each first leg 7 is fixed to a respective terminal electrode 3 with a conductive material 8 such as a solder or a conductive adhesive. The solder may be applied, for example, by a solder dipping process or a reflow soldering process or by using a solder paste applied to a given position.

The distal end of the second leg 9 of the terminal 5 is bent perpendicular to the main section thereof to form a connection end 11 that is fixed to a substrate 10 (shown by a broken line). The connection end 11 may be bent inwardly as shown by a solid line or outwardly as shown by a dotted line.

By way of example, the metal plate 6 may have a thickness of 0.1 mm and the distance between the first leg 7 and the second leg 9 may be approximately 0.5 mm.

The inner face of the bent terminal 5 is provided with a solder-phobic surface 12 while the outer face of the bent terminal 5 is provided with a solder-philic surface 13. In this embodiment of the invention, both surfaces of the metal plate 6 originally have excellent soldering characteristics so that the surface 13 of the metal plate is the solder-philic surface. The solder-phobic surface 12 is formed by treating the opposed surface to cause it to have a poor affinity for solder. For example, a resinous material such as a nonconductive resin, rubber, or a conductive resin may be added to the surface to form the solder-phobic surface 12.

Alternatively, the solder-phobic surface 12 may be formed by a chemical process, for example oxidizing the surface of the metal plate 6. Additionally, solder may be applied to the solder-philic surface 13 of the metal plate 6 in order to further improve its soldering characteristics. Plating of solder, silver, gold or palladium is also useful to improve soldering characteristics.

As described above, the outer face of the bent terminal 5 (i.e., non-opposing surfaces 13) has a solder-philic surface. When the ceramic electronic part 1 is mounted onto the substrate 10, solder (not shown in the drawing) successfully spreads between the solder-philic surface 13 on the second leg 9 and the substrate 10, resulting in a desirable electrical and mechanical connection.

In this embodiment, the gap $\underline{a}$ between the ceramic electronic part main body 2 and the substrate 10 is preferably set to be 0.25 mm or less to improve the shear strength of the terminal 5. Even with such a small gap, the inner solder-phobic surface 12 of the bent terminal 5 inhibits invasion of solder, which is used to mount the ceramic electronic part 1 to the substrate, into the space between the first leg 7 and the second leg 9, and thus the formation of a solder bridge.

The distal end of the first leg 7 of the terminal 5 is preferably bent along the terminal electrode 3 of the ceramic electronic part body 2. Such a configuration also effectively inhibits the invasion of the solder into the gap between the legs 7 and 9.

Second Embodiment

Figure 3:
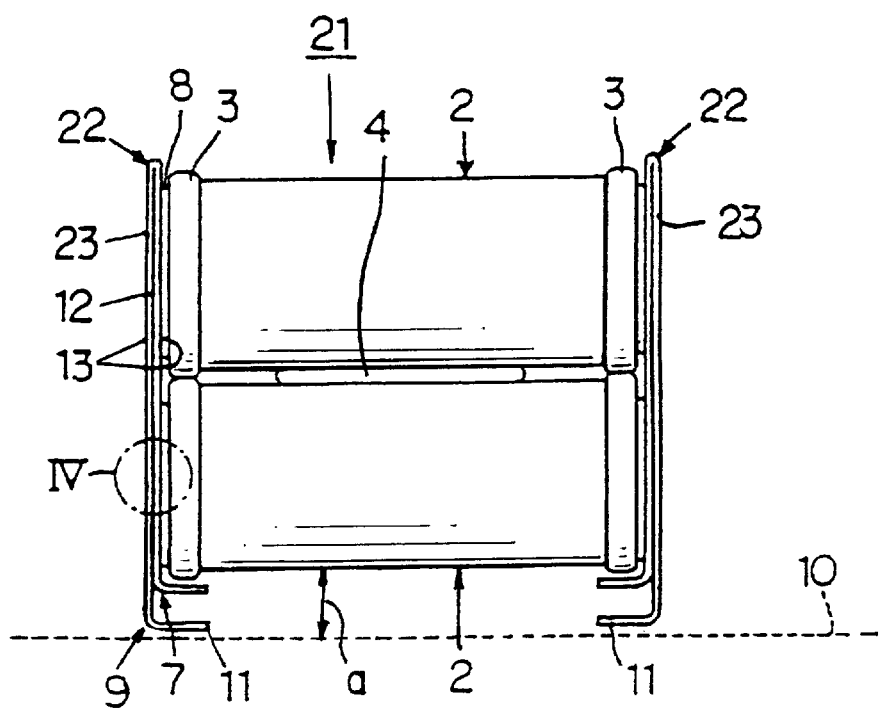
FIG. 3 is a front view of a ceramic electronic part constructed in accordance with a second embodiment of the present invention.
Figure 4:
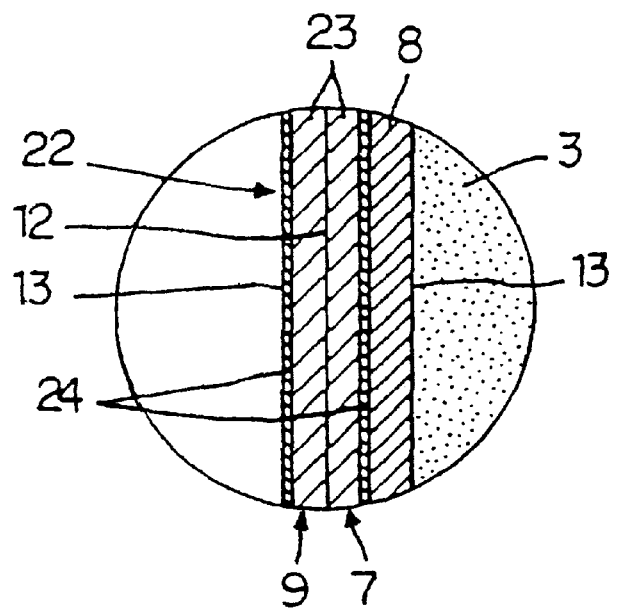
FIG. 4 is an enlarged cross-sectional view of the section IV in FIG. 3.

FIG. 3 is a front view of a ceramic electronic part 21 in accordance with a second embodiment of the present invention. FIG. 4 is an enlarged cross-sectional view of the section IV in FIG. 3.

The ceramic electronic part 21 has many elements having the same functions as the ceramic electronic part 1 in the first embodiment. A detailed description of these elements and their function will therefor be omitted.

The terminal 22 is composed of a metal bent into a U shape. A first leg 7 and a second leg 9 of the bent terminal 22 come into contact with each other over almost their entire length. The inner surface of the bent terminal 22 (i.e., the opposing surfaces 12) are solder-phobic surface 12, whereas the outer surface has a solder-philic. The original metal plate 23 in this embodiment has surfaces having poor affinity for solder so that an untreated surfaces 12 of the metal plate 23 is solder-phobic. The solder-philic surfaces 13 are formed by treating one of the surfaces of the metal plate 23 to cause it to have an affinity for solder. For example, the metal plate 23 may be stainless steel and a solder-philic layer 24 may be solder onto one surface of the stainless steel to form the solder-philic surfaces 13.

As in the first embodiment, the gap $\underline{a}$ between the ceramic electronic part main body 2 and the substrate 10 is preferably 0.25 mm or less to improve the shear strength of the terminal 22.

In accordance with this embodiment, the original solder-phobic surfaces 12 of the stainless steel plate 23 prevents invasion of the solder (not shown in the drawings), which is used for mounting the ceramic electronic part 21 onto the substrate, into the gap between the first leg 7 and the second leg 9 of the bent terminal 22. Thus, no solder bridge is formed.

The configuration of this embodiment has the following advantages. Since the first leg 7 and the second leg 9 of the bent metal plate 23 come into contact with each other, the electrical path in the terminal 22 is low despite the fact that the terminal 22 is relatively long. This avoids the undesirable formation of a relatively large inductance component in the long terminal 22.

If it is desirable to form a solder-phobic layer 14 on top of the surface of the metal plate 23 (as in the first embodiment), a conductive material such as a conductive resin is used for the solder-phobic layer 14 to ensure an electrical connection between the inner surfaces of the first and second legs of the metal plate 23 to ensure the short electrical path and the foregoing advantages.

Third Embodiment

Figure 5:
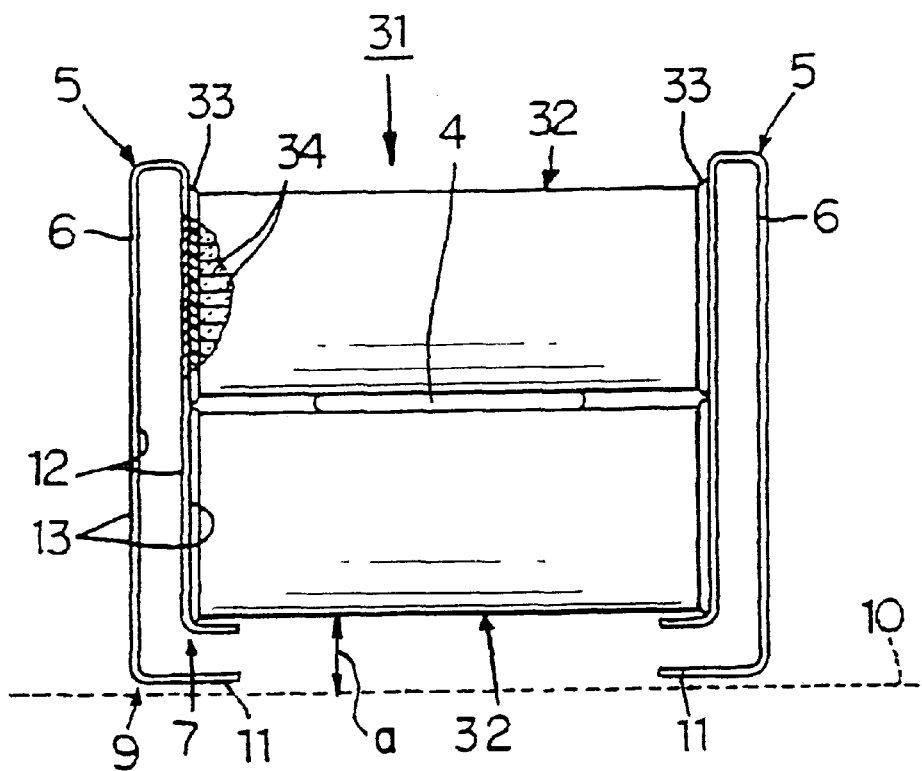
FIG. 5 is a front view, including a partly sectional view, of a ceramic electronic part constructed in accordance with a third embodiment of the present invention.

FIG. 5 is a front view of a ceramic electronic part 31 in accordance with a third embodiment of the present invention. This view includes a partial sectional view showing a portion of the internal structure of the ceramic electronic part body 32. This embodiment includes many of the same structural features as the foregoing embodiment and a detailed description of those features will be omitted.

In the ceramic electronic part 31 in FIG. 5, the terminal electrodes 33 of each ceramic electronic part body 32 also functions as a bonding material, and the terminals 5 are fixed to the terminal electrodes 33. In the embodiment illustrated, the ceramic electronic part body 32 is a monolithic ceramic capacitor. Internal electrodes 34 are formed in the capacitor as shown in the partial sectional view of FIG. 5. Terminal electrodes 33 formed on the opposite ends of each ceramic electronic part body 32 are composed of, for example, a conductive resin. The conductive resin electrically and mechanically connects the terminals 5 with the ceramic electronic part bodies 32. The configuration of a terminal 5 in FIG. 5 is substantially the same as that in the first embodiment.

As in the prior embodiments, the gap a between the ceramic electronic part main body 32 and the substrate 10 is preferably set to be 0.25 mm or less to improve the shear strength of the terminal 5. Even with such a small gap, the inner solder-phobic surface 12 of the bent terminal 5 inhibits invasion of the solder, which is used for mounting of the ceramic electronic part 1, into the space between the first leg 7 and the second leg 9, and thus the formation of a solder bridge.

The terminal 22 shown in the second embodiment may be substituted for the terminal 5 of this embodiment.

The present invention includes various modifications of the above-described embodiments within the scope of the present invention. For example, the number of the ceramic electronic part bodies can be changed without limitation, that is, it may be one, three or more instead of the two illustrated in the embodiments. The ceramic electronic part bodies 2 or 32 may form ceramic electronic parts other than a monolithic ceramic capacitor. Each ceramic electronic part body 2 or 32 may have additional terminal electrodes, including at positions other than the two ends. Each terminal 5 or 22 may have an appropriate bent pattern other than those illustrated in the embodiments.

Example 1

A ceramic electronic part 1 shown in FIG. 1 was made as follows. Two ceramic electronic part bodies 2, that is, two lead monolithic ceramic capacitors of 50 μF with a height of 2.5 mm, a width of 5.0 mm, and a depth of 5.5 mm, were prepared. In the drawings, the vertical size is the height and the direction perpendicular to the drawing is the depth. The ceramic electronic part bodies 2 were mounted into a holder. A 0.1-μm Ti layer, a 0.5-μm Ni(30%)Cu layer, and a 0.7-μm Ag layer were deposited, in that order, on the two opposing sides of each body by sputtering to form a layered terminal electrode 3. These ceramic electronic part bodies 2 were stacked and bonded to each other with an epoxy adhesive 4.

Metal plates 6 of brass with a thickness of 0.1 mm were prepared. One surface of each metal plate 6 was coated with a fluoroethylene resin to form a solder-phobic layer 14 that functioned as the solder-phobic surface 12, and the other surface, that is, the solder-philic surface 13 was coated with a solder (Sn/Pb=9/1). Each metal plate 6 was bent into a U shape. The gap between the first leg 7 and the second leg 9 of the bent plate 6 was set to 0.3 mm.

Two terminals 5 were put into contact with the terminal electrodes 3 and these were fixed with a hot solder (Sn/Pb= 8/92). The resulting ceramic electronic part 1 was subjected to evaluation of cycle reliability in response to thermal shock. The ceramic electronic part 1 was placed on a given position of the substrate 10 and mounted by reflow soldering using an eutectic solder (Sn/Pb=60/40). Five hundred cycles of thermal shock (−50° C. for 30 min., −25° C. for 3 min., and then −125° C. for 30 min.) were applied to the mounted ceramic electronic part. The cycle reliability was evaluated by the rate of change in volume between that before the test and that after the test. The electronic parts having a rate of change of volume of 10% or more were judged as rejected products. Thirty-six ceramic electronic parts were tested. All of them were satisfactory products. No solder bridge was found in the terminals 5 of these ceramic electronic parts 1.

For comparison, thirty-six other ceramic electronic parts were tested. Each of these parts had two surfaces coated with a solder (Sn/Pb=9/1) and thus did not have a solder-phobic layer 14. The other configurations were the same as those in Example 1. Nine parts were rejected products. Some bridges were observed in the terminals of the rejected products.

Next, ceramic electronic parts having different gaps between the ceramic electronic part main bodies and the substrates (0.1 mm for Example 1-1, 0.2 mm for Example 1-2, 0.25 mm for Example 1-3, and 0.3 mm for Comparative Example 1) were prepared.

As samples for comparison, solder-coated brass terminals with a thickness of 0.1 mm having two solder-philic surfaces were prepared. The ceramic electronic parts had different gaps between the ceramic electronic part main bodies and the substrates (0.2 mm for Comparative Example 2, 0.3 mm for Comparative Example 3, and 0.5 mm for Comparative Example 4). The other configurations of these terminals were the same as in Example 1. Each ceramic electronic part was mounted to a given position of the substrate by reflow soldering using an eutectic solder (Sn/Pb=60/40). The shear strength of the ceramic electronic parts and the ratio of the rejected products to the total products were evaluated. A product having a shear strength of 10 kgf or more suggests that the terminal is not deformed by a force applied from the transverse direction. The rejected product indicates a product having solder bridges between the first leg and the second leg of the bent terminal. The results are shown in Table 1.

TABLE 1

| | Gap size (mm) | Shear strength (kgf) | Ratio of rejected products (%) |
|---|---|---|---|
| Example 1-1 | 0.1 | 20 | 0 |
| Example 1-2 | 0.2 | 18 | 0 |
| Example 1-3 | 0.25 | 12 | 0 |
| Comparative Example 1 | 0.3 | 8 | 0 |
| Comparative Example 2 | 0.2 | 18 | 100 |
| Comparative Example 3 | 0.3 | 8 | 0 |
| Comparative Example 4 | 0.5 | 5 | 0 |

The results shown in Table 1 illustrate that a gap of 0.25 mm or less satisfies a shear strength of 10 kgf or more as in Examples 1-1 to 1-3 and Comparative Example 2. In Comparative Example 2, however, the inner face of the bent terminal did not have a solder-phobic surface and the gap between the first leg and the second leg, that is, less than 0.3 mm, is significantly small, hence all the mounted products were rejected in spite of the use of the U-shaped terminal. In contrast, in Examples 1-1 to 1-3, since each inner face had a solder-phobic surface, no product was rejected after mounting the U-shaped terminal having a gap of 0.25 mm or less.

Example 2

A ceramic electronic part 21 shown in FIG. 3 was made as follows. Two ceramic electronic part bodies 2, that is, two lead monolithic ceramic capacitors were prepared as described in Example 1. A paste containing silver/palladium powder was coated on the two ends of each ceramic electronic part body 2, and baked at a temperature of 600° C. or more to form a terminal electrode 3 of a thick film. These ceramic electronic part bodies 2 were stacked with an epoxy adhesive 4.

Metal plates 23 of stainless steel with a thickness of 0.1 mm were prepared. A solder-philic layer 24 as the solder-philic surface 13 had been formed on one face of each metal plate 23 by soldering (Sn/Pb=9/1). Each metal plate 23 was bent into a U shape, and the first leg 7 and the second leg 9 of the bent plate were put into contact with each other.

Each terminal 22 was positioned on the terminal electrode 3 and these were fixed to each other by reflow soldering of a high-temperature solder paste (Sn/Pb=8/92) interposed therebetween. The resulting ceramic electronic part 21 was subjected to evaluation of cycle reliability on thermal shock as in Example 1. Thirty-six ceramic electronic parts were tested. All of them were satisfactory products. No solder bridge was found in the terminals 22 of these ceramic electronic parts 21.

The ceramic electronic part 21 had a resonant frequency of 385 kHz. The ceramic electronic part 1 of Example 1 for comparison had a resonant frequency of 300 kHz. The length of the terminal in Example 1 contributed to the formation of the inductance component, whereas the inductance component in Example 2 was reduced by electrical conduction between the first leg 7 and the second leg 9 even if the length of the terminal 22 was substantially the same as that in Example 1.

Example 3

A ceramic electronic part 1 shown in FIG. 1 was made as follows. Two ceramic electronic part bodies 2 as lead monolithic ceramic capacitors were prepared. A paste containing silver powder was coated on the two ends of each ceramic electronic part body 2 and baked at a temperature of 600° C. A Ni layer and a Sn/Pb layer were deposited on the thick silver layer by wet plating to form a terminal electrode 3. The two ceramic electronic part bodies 2 were stacked and bonded to each other with an epoxy adhesive 4.

Metal plates 6 of phosphorus bronze with a thickness of 0.1 mm were prepared. One surface of each metal plate 6 was coated with a heat-resistant rubber to form a solder-phobic layer 14 that functioned as the solder-phobic surface 12. Each metal plate 6 was bent into a U shape. The gap between the first leg 7 and the second leg 9 of the bent plate 6 was set to 0.3 mm.

The terminals 5 were fixed to the terminal electrodes 3 with a conductive resin. The resulting ceramic electronic part 1 was subjected to evaluation of cycle reliability on thermal shock as in Example 1. Thirty six ceramic electronic parts were tested. All of them were satisfactory products. No solder bridge was found in the terminals 5 of these ceramic electronic parts 1.

Example 4

A ceramic electronic part 31 shown in FIG. 5 was made as follows. Two ceramic electronic part bodies 32 as lead monolithic ceramic capacitors were prepared as described in Example 1. The ceramic electronic part bodies 32 were subjected to barrel polishing to sufficiently expose the two ends of each internal electrode 34. These ceramic electronic part bodies 2 were stacked with an epoxy adhesive 4.

Soldered (Sn/Pb=4/6) metal plates 6 of brass with a thickness of 0.1 mm were prepared. A conductive resin as a solder-phobic layer 14 was coated on one face of each metal plate 6 to form a solder-phobic surface 12. Each metal plate 6 was bent into a U shape, and the first leg 7 and the second leg 9 of the bent plate were put into contact with each other.

A conductive resin was applied onto the two ends of each ceramic electronic part body 32 to form terminal electrodes 33. Each terminal 5 was fixed to each end of the ceramic electronic part bodies 32. The resulting ceramic electronic part 1 was subjected to evaluation of cycle reliability on thermal shock as in Example 1. Thirty-six ceramic electronic parts were tested. All of them were satisfactory products. No solder bridge was found in the terminals 5 of these ceramic electronic parts 31. The ceramic electronic part 31 had a resonant frequency of 360 kHz.

In the above-mentioned embodiments and Examples, the first leg 7 and the second leg 9 of each terminal 22 or 5 preferably has a first protruded section 310 and a second protruded section 320, respectively, as shown in FIGS. 6 and 7. The first protruded section 310 and the second protruded section 320 fit into one another. These sections 310 and 320 may be formed by bending of the metal plates. The second protruded section 320 mates with the recess in the first protruded section 310. The fitting of these two protruded sections 310 and 320 prevents deformation of the terminal 22 or 5 by a transverse force. In addition, the configuration of the first leg 7 and the second leg 9 coming into contact with each other prevents the deformation of the terminal 22 or 5.

FIG. 8 is an enlarged cross-sectional view of a circled portion I of the terminal shown in FIG. 7. As shown in FIG. 8, the first and second protruded sections 310 and 320 protrude towards the terminal electrodes 33 or 3. A gap with a given thickness is inevitably formed between the first protruded section 310 and the terminal electrode 33 or 3. The gap is uniformly embedded with a conductive material 8 by a solder dipping process, by a reflow-soldering process, or by using a conductive adhesive. The uniform conductive material 8 has plastic deformation effects and thus can effectively prevent an electronic part body 32 or 2 from breaking by the difference in the thermal expansion coefficients between an electronic part body 32 or 2 and a terminal 22 or 5.

In FIG. 8, the first protruded section 310 comes into contact with the terminal electrode 33 or 3; however, a gap may be formed between the first protruded section 310 and the terminal electrode 33 or 3. Further, the gap may be filled with the conductive material 8.

As shown in FIGS. 6 and 7, the first and second protruded sections 310 and 320 form long ribs extending in the vertical direction, that is, perpendicular to the bent line of the terminal 22 or 5. These ribs increase the strength of the terminal 22 or 5 itself. Thus, deformation is effectively prevented even in a relatively thin terminal 22 or 5.

In FIG. 6, the terminal 22 or 5 has two first protruded sections 310 in the first leg 7 and two second protruded sections 320 in the second leg 9. The number of first and second protruded sections 310 and 320 can be changed without limitation to one, three or more.

As long as the terminal has a sufficient strength for practical use, these protruded sections 310 and 320 can have any shape other than the long rib, for example, a spot.

In accordance with the present invention, the solder-phobic surface at the inner face of the U-shaped metal terminal prevents invasion of solder into the gap between the first leg and the second leg of the bent terminal while mounting the chip ceramic electronic part on the substrate. On the other hand, the solder-philic surface at the outer face of the terminal permits satisfactory soldering between the terminal and the substrate. Thus, the formation of solder bridges is securely prevented between the first leg and the second leg, and the terminal can move without limitation in response to thermal expansion and shrinkage. Accordingly, the ceramic electronic part can be prevented from damage by thermal shock.

Since the inner solder-phobic surface prevents the invasion of solder into the gap between the first leg and the second leg without increasing the gap distance, this results prevention of bulkiness of the chip electronic part without modification of the terminal into a readily deformable shape.

When at least portions of the first leg and the second leg come into contact with each other by a conductive solder-phobic surface, electrical conduction between these two legs can be achieved. Thus, the electrical path can be reduced relative to the length of the terminal and the formation of an undesired inductance component in the terminal can be reduced.

When the ceramic electronic part in accordance with the present invention includes a plurality of ceramic electronic part bodies, two terminals are connected to the terminal electrodes at the two sides of the ceramic electronic part. These terminals electrically and mechanically connect individual ceramic electronic part bodies.

The present invention may be embodied in other specific forms without departing from the spirit or essential attributes thereof and, accordingly, reference should be made to the appended claims, rather than to the foregoing specification, as indicating the scope of the invention.

What is claimed is:

1. A ceramic electronic part comprising:
   a chip ceramic electronic part body having terminal electrodes provided on opposite sides thereof; and
   a pair of terminals, each comprising a metal plate bent into a generally U shape to define first and second opposing legs, the first and second legs having solder-phobic opposing surfaces which face one another and solder-philic non-opposing surfaces which face away from one another, the non-opposing surface of the first leg of each terminal being attached to a respective terminal electrode.

2. A ceramic electronic part according to claim 1, wherein the bent terminals are formed of a metal having excellent soldering characteristics so that the non-opposing surfaces of the first and second legs have excellent soldering characteristics and wherein the opposing surfaces of the first and second legs have been treated to have a poor affinity for solder.

3. A ceramic electronic part according to claim 2, wherein a resinous material is located on the opposing surfaces of the first and second legs of the terminals.

4. A ceramic electronic part according to claim 3, wherein the resinous material is one material selected from the group consisting of nonconductive resins, conductive resins and rubbers.

5. A ceramic electronic part according to claim 2, wherein solder is located on the non-opposing surfaces the terminals.

6. A ceramic electronic part according to claim 3, wherein solder is located on the non-opposing surfaces of the terminals.

7. A ceramic electronic part according to claim 4, wherein solder is located on the non-opposing surfaces of the terminals.

8. A ceramic electronic part according to claim 1, wherein the terminals are formed of a material having poor soldering characteristics and wherein the solder-philic surfaces are formed by treating the non-opposing surfaces of the terminals to cause them to have an affinity for solder.

9. A ceramic electronic part according to claim 8, wherein a solder-philic material having high affinity for solder is located on the non-opposing surfaces.

10. A ceramic electronic part according to claim 9, wherein the solder-philic material is one material selected from the group consisting of solder, Ag, Au and Pd.

11. A ceramic electronic part according to any one of claims 1 to 10, wherein at least a portion of the opposing surfaces of the first and second legs contact one another.

12. A ceramic electronic part according to any one of claims 1 to 10, wherein the ceramic electronic part includes a plurality of ceramic electronic part bodies each including a pair of terminal electrodes, a first terminal electrode of each ceramic electronic part body being aligned with one electrode from the remaining ceramic electronic part bodies to form a first set of aligned terminal electrodes, a second terminal electrode of each ceramic electronic part body being aligned with the other electrode from the remaining ceramic electronic part bodies to form a second set of aligned terminal electrodes, and the first leg of one of the bent terminals being physically and electrically attached to one set of aligned terminal electrodes, the second leg of one of the bent terminals electrode being attached to the other set of aligned terminal electrodes.

13. A ceramic electronic part according to claim 1, wherein the terminals are soldered to a wiring substrate, and a gap between the ceramic electronic part main body and the wiring substrate is 0.25 mm or less.

14. A ceramic electronic part according to claim 1, wherein the first and second legs of each bent terminal has a respective protrusion which interlocks with a protrusion of the other leg to reduce relative movement between the two legs.

15. A ceramic electronic part according to claim 14, wherein each of the protrusions extends in a direction toward the terminal electrode to which the bent terminal is connected.

16. A ceramic electronic part according to claim 14, wherein each protrusion is elongated.

17. A ceramic electronic part according to claim 1, wherein the first and second legs of each bent terminal are substantially coextensive with each other.

18. A ceramic electronic part according to claim 17, wherein the first and second legs of each terminal are substantially parallel to one another.

19. A ceramic electronic part according to any one of claims 1 and 18, wherein each of the second legs include a bent portion which is adapted to be coupled to a substrate to mount the ceramic electronic part to the substrate.

20. A ceramic electronic part according to claim 1, wherein the opposing surfaces of each respective terminal are in contact with one another over substantially the entire length of the legs.

* * * * *